(12) United States Patent
Davenport et al.

(10) Patent No.: US 6,437,628 B1
(45) Date of Patent: Aug. 20, 2002

(54) DIFFERENTIAL LEVEL SHIFTING BUFFER

(75) Inventors: William H. Davenport, Portland; Yong Yang, Beaverton, both of OR (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 0 days.

(21) Appl. No.: 10/011,363

(22) Filed: Nov. 5, 2001

(51) Int. Cl.[7] .................................................. H03L 5/00
(52) U.S. Cl. ..................................... 327/333; 327/112
(58) Field of Search ........................... 327/108, 109, 327/112, 309, 319, 321, 328, 333; 326/63, 68, 80–85

(56) References Cited

U.S. PATENT DOCUMENTS

| | | | | |
|---|---|---|---|---|
| 4,963,766 A | * | 10/1990 | Lundberg | 326/103 |
| 5,739,726 A | * | 4/1998 | Ling | 326/81 |
| 5,894,238 A | * | 4/1999 | Chien | 326/26 |
| 5,990,711 A | * | 11/1999 | Sekimoto | 323/316 |
| 6,184,703 B1 | * | 2/2001 | Vest et al. | 326/27 |
| 6,236,248 B1 | * | 5/2001 | Koga | 329/27 |
| 6,323,704 B1 | * | 11/2001 | Pelley et al. | 327/112 |

* cited by examiner

Primary Examiner—My-Trang Nu Ton
(74) Attorney, Agent, or Firm—Sjkerven Morrill LLP; Christopher B. Allenby

(57) ABSTRACT

A buffer includes two pairs of push-pull configured transistors as output drivers. One transistor in the first push-pull pair is controlled by an input signal and the second transistor in the first push-pull pair is controlled via a current mirror by a complement of the input signal. Similarly, one transistor in the second push-pull pair is controlled by the complement of the input signal and the second transistor in the second push-pull pair is controlled via another current mirror by the input signal.

19 Claims, 6 Drawing Sheets

US 6,437,628 B1

DIFFERENTIAL LEVEL SHIFTING BUFFER

BACKGROUND

1. Field of Invention

The present invention relates to signal buffers, and in particular to a differential level shifting buffer.

2. Related Art

Level shifting buffers perform two functions in emitter-coupled logic (ECL) and source-coupled FET logic (SCFL) circuits. First, such buffers are used as a buffer between input and output circuits. Second, such buffers are used to shift the logic threshold voltage (the voltage defining the difference between a binary logic high or low, "on" or "off", 1 or 0) of signals received from an input circuit to a second logic threshold voltage output to an output circuit. Such buffers frequently use a differential amplifier as an input stage, followed by a source-follower stage which performs the level shifting function. The source-follower stage may have two transistors, each of which conducts a current which passes through an impedance and a pull-down current source. The output of the buffer is taken from the nodes between the impedances and their respective pull-down current sources.

In an electrical environment with a low voltage power supply, or when the common mode potential (average potential between two differential signals) needs to be level shifted to a value near the lower supply voltage (e.g., ground) that is lower than can be sustained by a pull-down current source, these conventional circuits start to lose gain, amplitude, and bandwidth due to head room bias compression ($V_{DS}$ or $V_{CE}$ operating bias is below or near the "knee voltage" of the pull-down current source transistor) in the pull-down current sources.

SUMMARY

A buffer includes two pairs of push-pull configured transistors and a compensation circuit. An input signal and its complement (e.g., the signal and complement representing a binary logic high and low, "on" and "off", or 1 and 0, respectively) is received from, for example, a differential amplifier and voltage level shifting circuit. One transistor in the first push-pull pair receives the complement of the input signal, and one transistor in the second push-pull pair receives the input signal.

The second transistor in the first push-pull pair is coupled with a transistor in the compensation circuit to act as a first current mirror. Similarly, the second transistor in the second push-pull pair is coupled with another transistor in the compensation circuit to act as a second current mirror. Current in the first current mirror is controlled by a third transistor in the compensation circuit, and current in the second current mirror is controlled by a fourth transistor in the compensation circuit.

The signal controlling the third transistor in the compensation circuit is either the same as or is proportional to the input signal received by the first transistor in the second push-pull pair. The signal controlling the fourth transistor in the compensation circuit is either the same as or is proportional to the input signal received by the first transistor in the first push-pull pair. Thus as the first transistor in the first push-pull pair is controlled by the complement of the input signal, the second transistor in the first push-pull pair is controlled via the first current mirror by the input signal. Similarly, as the first transistor in the second push-pull pair is controlled by the input signal, the second transistor in the second push-pull pair is controlled via the second current mirror by the complement of the input signal.

DETAILED DESCRIPTION

Figure 1:
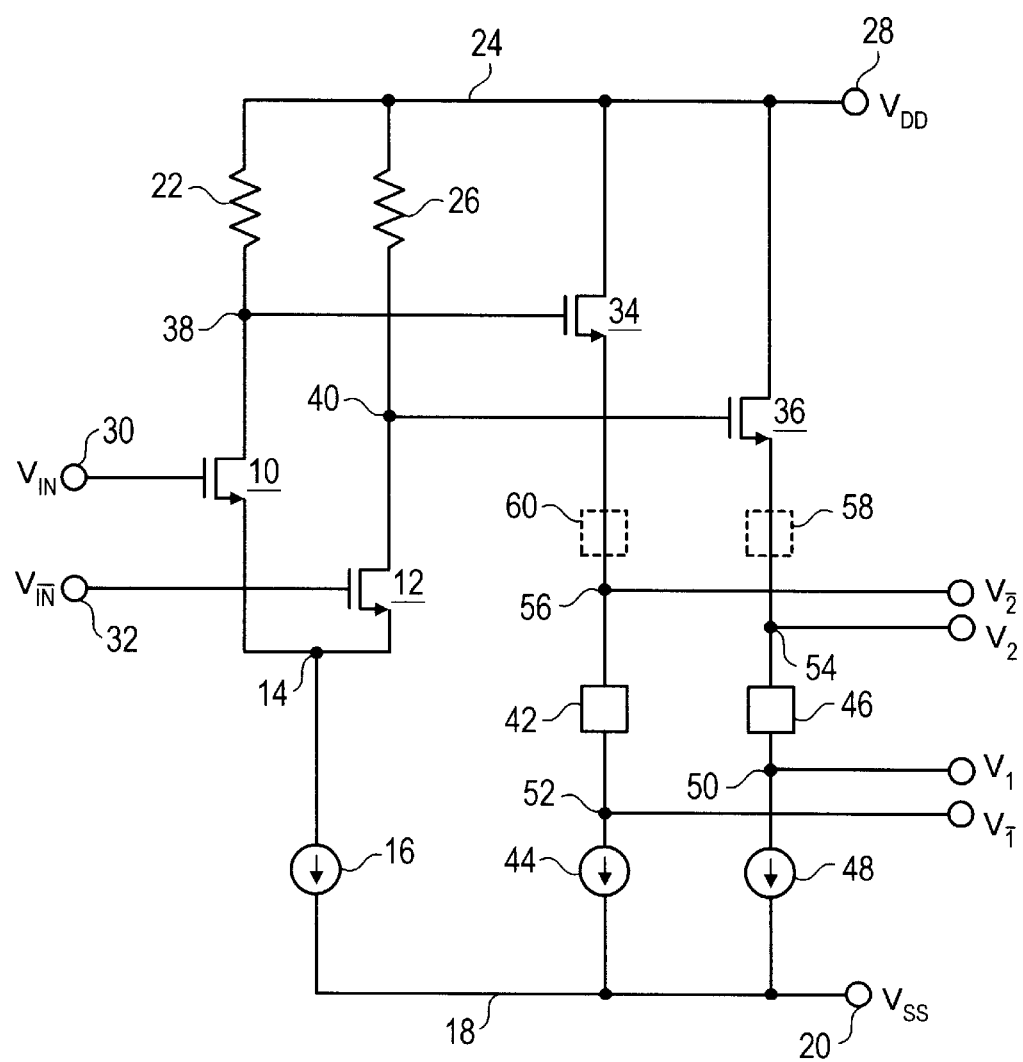
FIG. 1 is a schematic diagram of a differential amplifier and buffer circuit.
Figure 2:
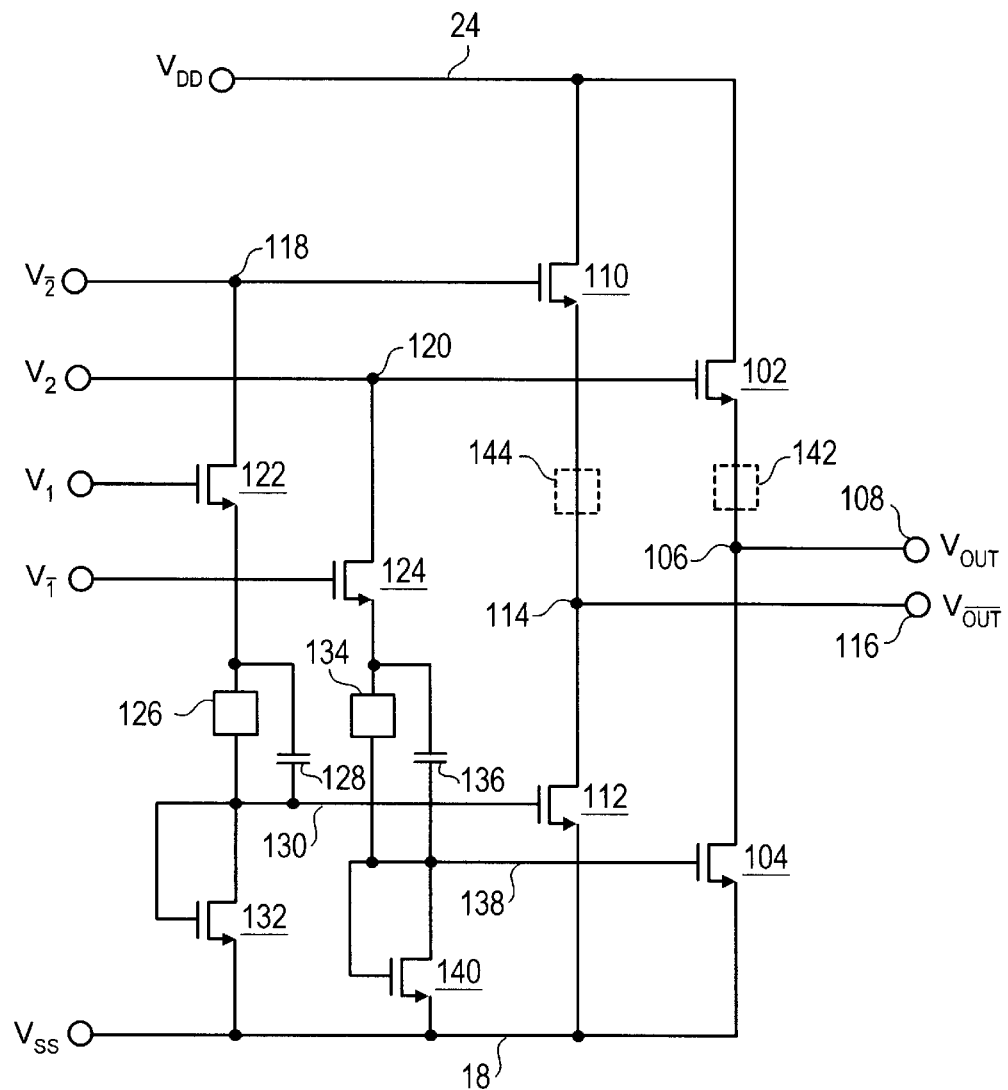
FIG. 2 is a schematic diagram of a voltage level shifting buffer circuit.
Figure 3:
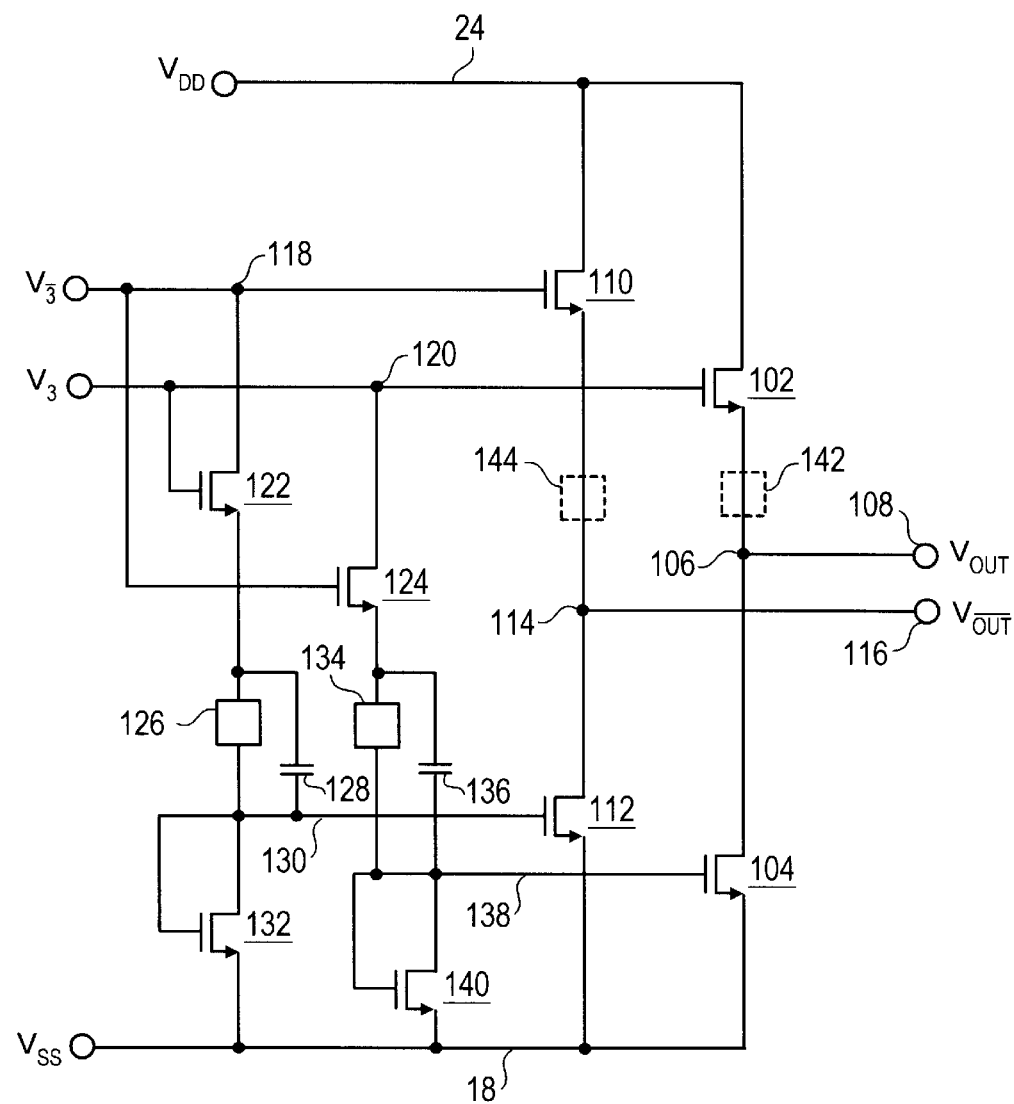
FIG. 3 is a schematic diagram of a second voltage level shifting buffer circuit.

Like numerals are used for like and corresponding parts of the various drawings as shown in FIGS. 1, 2, and 3. Embodiments are shown using n-channel field effect transistors (e.g., gallium arsenide (GaAs) metal semiconductor FETs (MESFETs)), which are illustrative of active electronic devices (e.g., transistors) having two current handling terminals (e.g., source and drain) and a control terminal (e.g., gate) controlling the current passing between the current handling terminals. The high carrier mobility in GaAs embodiments provides higher frequency response over silicon embodiments, as well as higher operating temperature tolerance and power handling capability, and lower noise. Other embodiments are constructed using other semiconductor technologies (e.g., indium phosphide) that take advantage of the unique characteristics of those technologies. Embodiments may be constructed using various active devices such as CMOS and bipolar transistors.

FIG. 1 is a schematic diagram of a differential amplifier that is illustrative of a differential amplifier used as an input stage of level-shifting buffer embodiments in accordance with the invention. The sources of transistors 10 and 12 are coupled at node 14. Conventional current source 16 is coupled between node 14 and lower supply voltage line 18. Lower supply voltage $V_{SS}$ (e.g., ground potential) is applied to line 18 at lower supply voltage terminal 20. Resistor 22 is coupled between the drain of transistor 10 and upper supply voltage line 24. Similarly, resistor 26 is coupled between the drain of transistor 12 and line 24. Upper supply voltage line 24 receives upper supply voltage $V_{DD}$ (e.g., 3.3 volts) at upper supply voltage terminal 28. The gates of transistors 10, 12 are coupled to input terminals 30, 32 respectively. A pair of complementary (i.e., representing complementary binary logic levels) differential input signals $V_{IN}$, $V_{\overline{IN}}$ is received at terminals 30, 32 respectively. As shown in FIG. 1, transistors 10, 12, current source 16, and resistors 22, 26 are coupled in a differential amplifier topology that provides a set of differential output signals at the drains of transistors 10, 12.

The drains of transistors 34, 36 are coupled to upper voltage supply line 24. The gate of transistor 34 is coupled to node 38 between the drain of transistor 10 and resistor 22. The gate of transistor 36 is coupled to node 40 between the drain of transistor 12 and resistor 26. Thus the gates of transistors 34, 36 receive the set of differential output signals from transistors 10, 12. The source of transistor 34 is coupled to one terminal of impedance 42. The other terminal of impedance 42 is coupled to one terminal of conventional current source 44. The other terminal of current source 44 is coupled to lower supply voltage line 18. The source of transistor 36 is coupled to one terminal of impedance 46. The other terminal of impedance 46 is coupled to one terminal of conventional current source 48. The other terminal of current source 48 is coupled to supply line 18. Transistors 34, 36 are coupled in a source-follower topology, thereby buffering the differential input signals received from transistors 10, 12.

Node 50 is defined between impedance 46 and current source 48, and node 52 is defined between impedance 42 and current source 44. Node 54 is defined between the source of transistor 36 and impedance 46, and node 56 is defined between the source of transistor 34 and impedance 42. To provide additional output voltage level shifting, in some cases optional impedance 58 is coupled between transistor 36 and node 54, and optional impedance 60 is coupled between transistor 34 and node 56. Impedances 42, 46, 58, 60 are conventional (e.g., resistors, diodes). As shown in FIG. 1, one set of complementary level-shifted output signals, $V_1$, $V_{\bar{1}}$ is available at nodes 50, 52 respectively. A second complementary set of level-shifted output signals $V_2$, $V_{\bar{2}}$ is available at nodes 54, 56 respectively.

The first set $V_1$, $V_{\bar{1}}$ or the second set $V_2$, $V_{\bar{2}}$ of level-shifted differential output signals is suitable for use in some circuit topologies. As discussed above, however, in circuits using a low-voltage power supply (e.g., 3.3 V) or if the common mode potential must be level-shifted down to a value close to $V_{SS}$ (e.g., $V_{SS}$+0.5 V, or a level too low to have headroom for a degeneration device), headroom bias compression in current sources 44, 48 causes a loss of gain, amplitude, and bandwidth in the buffered and level-shifted differential output signal sets.

FIG. 2 is a schematic diagram of an embodiment that enhances gain, amplitude, and bandwidth for outputs of the illustrative differential level-shifting buffer circuit shown in FIG. 1. Transistors shown in FIG. 2 are biased to operate in the saturated region. The level-shifted differential output signal pair $V_{OUT}$, $V_{\overline{OUT}}$ is driven by two push-pull configured transistor pairs. The drain of transistor 102 is coupled to upper supply voltage line 24. The source of transistor 102 is coupled to the drain of transistor 104 at node 106. The drain of transistor 110 is coupled to line 24 and the source of transistor 110 is coupled to the drain of transistor 112 at node 114. Push-pull transistor pair 102, 104 provide a differential level-shifted output signal $V_{OUT}$ at output terminal 108. Push-pull transistor pair 110, 112 provide a complementary differential level-shifted output signal $V_{\overline{OUT}}$, at output terminal 116. $V_{OUT}$, $V_{\overline{OUT}}$ are level-shifted from $V_2$, $V_{\bar{2}}$ through the $V_{GS}$ of transistors 102, 110. Optional impedances 142, 144 provide additional level-shifting.

The gate of transistor 110 is coupled to input node 118 and receives, for example, complementary differential signal $V_{\bar{2}}$. Likewise, the gate of transistor 102 is coupled to input node 120 and receives, for example, differential output signal $V_2$. Thus transistors 102, 110 buffer signals $V_2$, $V_{\bar{2}}$ respectively.

The drain of transistor 122 is coupled to node 118 and the drain of transistor 124 is coupled to node 120. The source of transistor 122 is coupled to one terminal of impedance 126 (e.g., resistor, diode) and to one terminal of capacitor 128. The other terminals of impedance 126 and capacitor 128 are coupled at node 130. Also coupled to node 130 are the drain and gate of transistor 132, and the gate of transistor 112. The source of transistor 124 is coupled to one terminal of impedance 134 (e.g., resistor, diode) and to one terminal of capacitor 136. The other terminals of impedance 134 and capacitor 136 are coupled at node 138. Also coupled to node 138 are the drain and gate of transistor 140, and the gate of transistor 104. The sources of transistors 104, 112, 132, 140 are coupled to lower supply voltage line 18 and receive voltage $V_{SS}$.

The gate of transistor 122 is coupled to receive, for example, differential level-shifted signal $V_1$. Transistor 122 buffers signal $V_1$, which causes current to flow in impedance 126. Transistor 132 is coupled in a current mirror configuration with push-pull transistor 112. The current mirror configuration causes the currents conducted by transistors 112, 132 to be proportional. And, the current passing through transistor 132 is determined by the current passing through transistor 122 and impedance 126.

The gate of transistor 124 is coupled to receive, for example, complementary differential level-shifted input signal $V_{\bar{1}}$. The combination of transistors 104, 124, 140 and impedance 134 functions similarly to the combination of transistors 112, 122, 132 and impedance 126 described above. Thus signals $V_1$, $V_{\bar{1}}$ control current passing through transistors 112, 104 respectively.

During switching, the current passing through transistor 122 decreases as the voltage of signal $V_1$ decreases, thereby boosting the increasing voltage $V_{\bar{2}}$ at node 118. Likewise, the current passing through transistor 124 decreases as the voltage of signal $V_{\bar{1}}$ decreases, thereby boosting the increasing voltage of $V_2$ at node 120. Proper bias on transistors 122, 124 should be maintained to provide a voltage boost. This voltage boosting decreases the amount of signal level attenuation between input signal pair $V_{IN}$, $V_{\overline{IN}}$ (FIG. 1) and output signal pair $V_{OUT}$, $V_{\overline{OUT}}$, over that which occurs between $V_{IN}$, $V_{\overline{IN}}$ and either $V_1$, $V_{\bar{1}}$ or $V_2$, $V_{\bar{2}}$.

Since transistors 122, 124 are each cross-coupled between an input signal and a complementary input signal, the mirrored currents in transistors 104, 112 cause transistor pairs 102, 104 and 110, 112 to function as push-pull output drivers. The output gain is $$\frac{(V_{OUT} - V_{\overline{OUT}})}{(V_2 - V_{\bar{2}})}.$$

This gain is accomplished by the push-pull action of $\Delta I$ in transistors 112, 104 working into the gm (transconductance) in the sources of transistors 110, 102. This gain does not have to be larger than one, but only larger than without this push-pull circuit. In some cases optional impedance 142 is coupled between transistor 102 and node 106, and optional impedance 144 is coupled between transistor 110 and node 114. Optional impedances 142, 144 (e.g., resistor, diode) provide additional voltage level shifting for output signals $V_{OUT}$, $V_{\overline{OUT}}$.

Capacitors 128 and 136 provide frequency compensation and bandwidth peaking. Frequency compensation allows the circuit to maintain a wide bandwidth. Bandwidth peaking means that the gain increases slightly before rolling off. The capacitors allow the input signals to bypass impedances 126 and 134, thereby providing a stronger drive to the gates of transistors 112 and 104 at higher frequencies. This stronger drive at higher frequencies causes a larger amplitude current to appear in the drains of transistors 112 and 104. Providing a larger current as frequency increases makes the rise and fall times of the outputs faster.

TABLES I and II list parameters for electronic components shown in FIGS. 1 and 2. For the values shown in TABLES I and II, resistors 22 and 26 are each 1000 Ohm resistances, current sources 16, 44, and 48 are each 1 milliampere, and capacitors 128, 136 are each 50 femtofarads. These values are illustrative.

TABLE I

| Transistor (GaAs MESFET) | Channel Width (μm) | Channel Length (μm) |
|---|---|---|
| 10 | 16 | 0.3 |
| 12 | 16 | 0.3 |
| 34 | 20 | 0.3 |
| 36 | 20 | 0.3 |
| 102 | 24 | 0.3 |
| 104 | 24 | 0.3 |
| 110 | 24 | 0.3 |
| 112 | 24 | 0.3 |
| 122 | 5 | 0.3 |
| 124 | 5 | 0.3 |
| 132 | 5 | 0.3 |
| 140 | 5 | 0.3 |

TABLE II

| Impedance | Value (Type/Ohms) |
|---|---|
| 42 | Resistive/1000 |
| 46 | Resistive/1000 |
| 126 | Resistive/1500 |
| 134 | Resistive/1500 |

FIG. 3 is a schematic diagram of another buffer embodiment. The circuit topology of the embodiment shown in FIG. 3 is similar to the topology of the embodiment shown in FIG. 2. Whereas the circuit shown in FIG. 2 receives two pairs of complementary input signals, however, the circuit shown in FIG. 3 receives only a single pair of complementary differential voltage level-shifted input signals $V_3$, $V_{\bar{3}}$, (e.g., $V_1$, $V_{\bar{1}}$ or $V_2$, $V_{\bar{2}}$, shown in FIG. 1). The gate of transistor 122 is coupled to node 120 and the gate of transistor 124 is coupled to node 118. Accordingly, complementary differential input signal $V_{\bar{3}}$ is received at the gates of transistors 110 and 124, and differential input signal $V_3$ is received at the gates of transistors 102 and 122. The current in transistor 124 decreases as the voltage of signal $V_{\bar{3}}$ drops, thereby boosting the rising signal $V_3$ voltage. Likewise, the current in transistor 122 decreases as the voltage of signal $V_3$ drops, thereby boosting the rising signal $V_{\bar{3}}$ voltage. This voltage boosting reduces the attenuation of a conventional source follower circuit, such as shown in FIG. 1. In such a conventional source follower circuit, the output is a voltage divided between the transconductance of transistor 36 and the impedance of current source 48. The current mirror, bypass capacitor, and push-pull functions operate as described above with reference to the circuit shown in FIG. 2.

Figure 4:
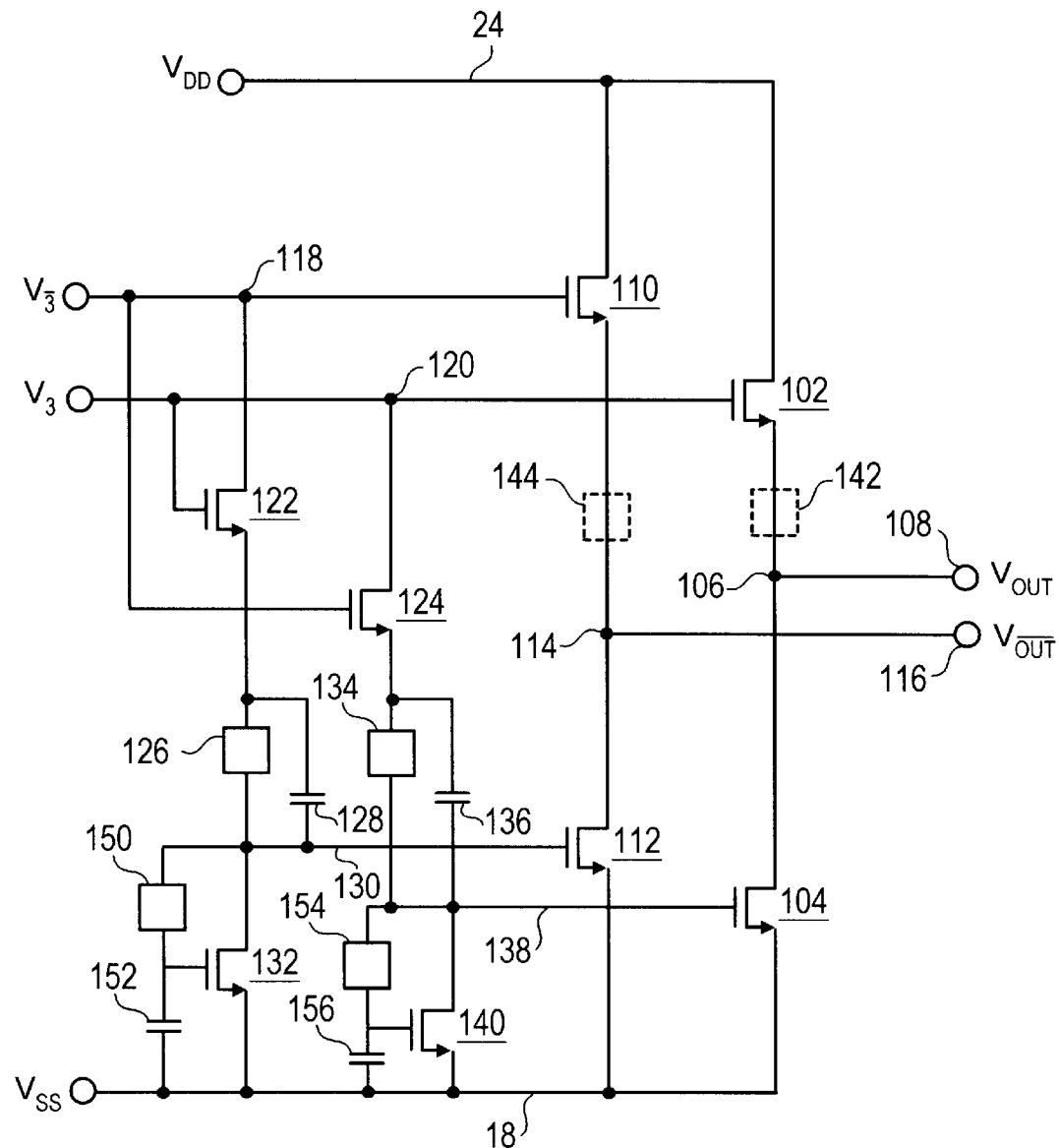
FIG. 4 is a schematic diagram of a third voltage level shifting buffer circuit.

FIG. 4 is a schematic diagram of yet another buffer embodiment. The circuit topology of the embodiment shown in FIG. 4 is similar to the embodiment shown in FIG. 3 except that additional components are coupled to transistors 132 and 140. As shown in FIG. 4, impedance 150 is coupled between node 130 and the gate of transistor 132. Capacitor 152 is coupled between the gate of transistor 132 and lower supply voltage line 18. Similarly, impedance 154 is coupled between node 138 and the gate of transistor 140, and capacitor 156 is coupled between the gate of transistor 140 and line 18. Illustrative values for impedances 150, 154 are 500 Ohms. Illustrative values for capacitors 152, 156 are 50 femtofarads. The addition of impedances 150, 154 and capacitors 152, 156 provides additional frequency compensation and bandwidth peaking over that provided by the embodiments shown in FIGS. 2 and 3. Impedance 150 and capacitor 152 add a time constant to transistor 132, which tends to increase the impedance looking into the drain of transistor 132 for rising signals and conversely lowers the impedance of the drain for falling signals. Impedance 154 and capacitor 156 act similarly on transistor 140. This action causes current mirror transistors 112 and 104 to have a peaked current amplitude response at high frequencies. The voltage boosting function of transistors 122 and 124 is as described above with reference to FIGS. 2 and 3.

The illustrative voltage level shifting buffer embodiments disclosed in FIGS. 2, 3, and 4 are particularly well suited to be used for level-shifting differential signals in an electrical environment of a reduced power supply (e.g., 5.0 V to 3.3 V) or when an input common mode signal needs to be voltage shifted to a voltage closer (e.g., within 0.5 V) to the lower supply voltage level $V_{SS}$.

Figure 5:
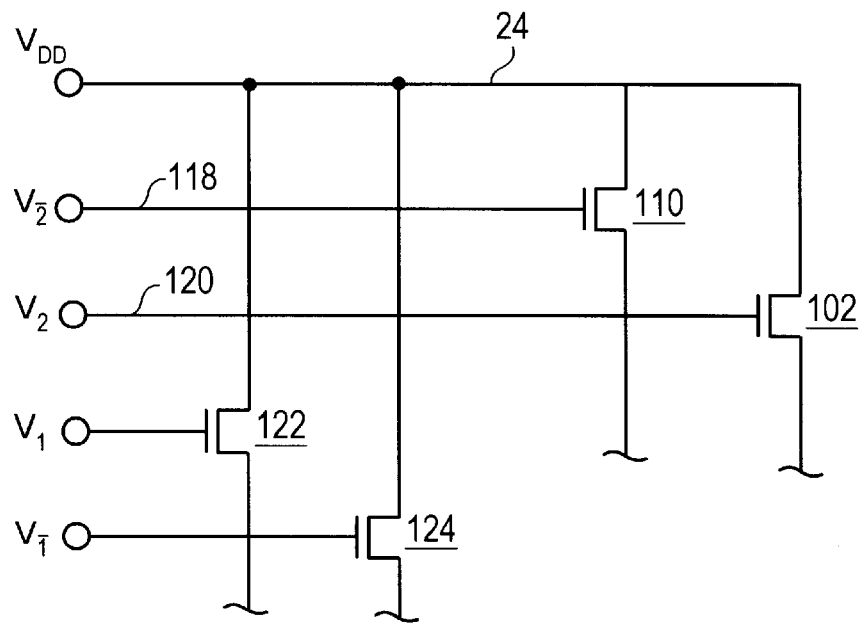
FIG. 5 is a schematic diagram showing a variation of a portion of the circuit shown in FIG. 2.

FIG. 5 is a schematic view showing a variation of a portion of the circuit embodiment depicted in FIG. 2. In the embodiment shown in FIG. 5, the drains of transistors 122 and 124 are coupled to upper voltage supply line 24 and receive upper supply voltage $V_{DD}$ rather than complementary input signals $V_2$, $V_{\bar{2}}$, as shown in FIG. 2. The remainder of the circuit coupled to transistors 102, 110, 122, 124 is as disclosed above with reference to FIG. 2.

Figure 6:
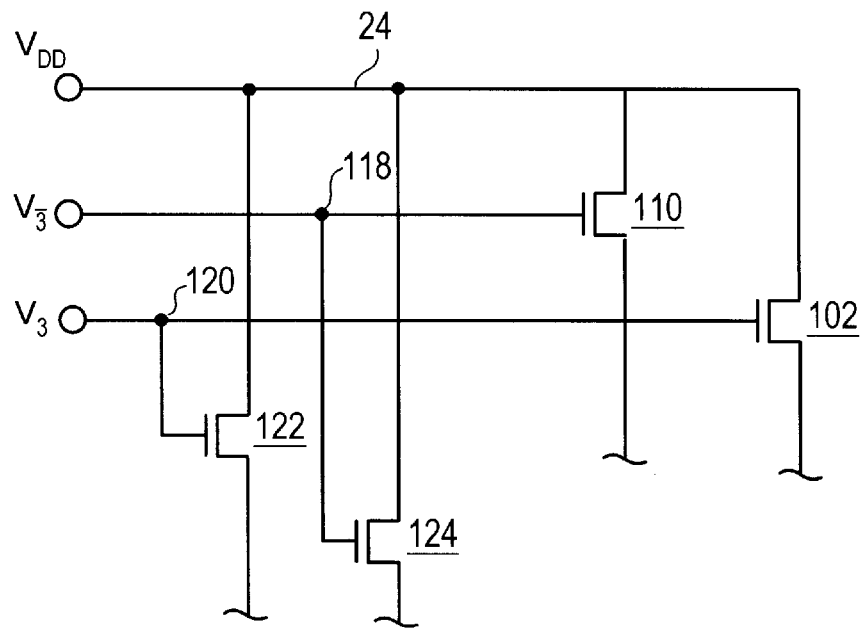
FIG. 6 is a schematic diagram showing a variation of a portion of the circuits shown in FIGS. 3 and 4.

FIG. 6 is a schematic view showing a variation of a portion of the circuit embodiments depicted in FIGS. 3 and 4. In the embodiment shown in FIG. 6, the drains of transistors 122 and 124 are coupled to upper voltage supply line 24 and receive voltage $V_{DD}$ rather than complementary signals $V_3$, $V_{\bar{3}}$ as shown in FIGS. 3 and 4. The remainder of the circuit coupled to transistors 102, 110, 122, 124 are as disclosed above with reference to FIGS. 3 and 4.

The embodiments shown in FIGS. 5 and 6 do not perform the voltage boosting function for the complementary input signals received by the gates of transistors 102, 110. The FIG. 5 and FIG. 6 topologies are used if the advantages of the push-pull output driver stage are desired, but available headroom biasing is insufficient to adequately bias transistors 122, 124. That is, the FIGS. 5 and 6 topologies are used primarily in place of the FIG. 3 topology if the voltages between $V_3$ and $V_{\bar{3}}$ and the sources of transistors 122 and 124 are insufficient to hold transistors 122 and 124 in the saturated bias region of operation. The cross-coupling of transistors 122 and 124 to the gates of transistors 112 and 104 is significant because this topology provides most of the push-pull gain. Cross-coupling transistors 122 and 124 to nodes 118 and 120 yields an additional benefit.

As illustrated by FIGS. 2–6, transistors 102, 104, 110, 112 are an output stage with transistors 110, 112 being coupled as a first push-pull amplifier pair and transistors 102, 104 being coupled as a second push-pull amplifier pair. Transistors 122, 124, 132, 140 are a cross coupling current reference circuit. The first transistors 102, 110 in each of the push-pull pairs receive at their gates an input signal and its complement, respectively. The second transistor 112 in the first push-pull pair is coupled in a current mirror configuration with transistor 132, the mirrored current being controlled by an input signal received at the gate of current control transistor 122. Likewise, the second transistor 104 in the second push-pull pair is coupled in a current mirror configuration with transistor 140, the mirrored current being controlled by a complementary input signal received at the gate of current control transistor 124. In some cases the input signals received by the gates of transistors 102, 122 are the same (e.g., FIGS. 3, 4, and 6), and in some cases these input signals are proportional (e.g., FIGS. 2 and 5). In such cases the complementary input signals received by the gates of transistors 110, 124 are the same or are proportional. In some cases transistor 122 is cross coupled such that the gate receives an input signal and one current handling terminal receives a complementary input signal. In such cases transistor 124 is cross coupled such that the gate receives a complementary input signal and one current handling terminal receives an input signal. The input signals and complementary input signals received by cross-coupled transistors 122, 124 are the same (e.g., FIGS. 3 and 4) or are proportional (e.g., FIG. 2). In some cases transistors 122, 124 are not cross coupled between input and complementary input signals, and one current handling terminal of each of current control transistors 122, 124 is coupled to an upper supply voltage (e.g., FIGS. 5 and 6). Gain and bandwidth for the embodiments shown in FIGS. 2–6 are optimized if transistors 102, 104, 110, 112, 122, 124, 132, and 140 are operated in the saturated region.

Figure 7:
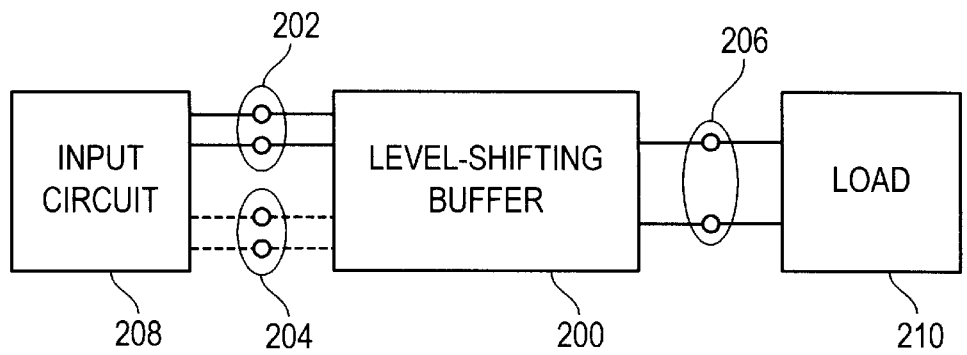
FIG. 7 is a diagrammatic view illustrating applications incorporating a voltage level shifting buffer circuit.

FIG. 7 is a diagrammatic view illustrating voltage level-shifting buffer applications. The voltage level shifting buffer embodiments described herein are shown as level-shifting buffer 200. Buffer 200 includes a first set of complementary input signal terminals 202 to receive, for example, complementary input signals $V_3$, $V_{\bar{3}}$. In some instances, buffer 200 includes a second set of complementary input signal terminals 204 to allow buffer 200 to receive two sets of complementary input signals such as $V_1$, $V_{\bar{1}}$ and $V_2$, $V_{\bar{2}}$. Buffer 200 also includes a pair of complementary output signal terminals 206 to output, for example, complementary output signals $V_{OUT}$, $V_{\overline{OUT}}$.

Various embodiments of input circuit 208 exist. In one instance input circuit 208 is a differential amplifier and signal buffer combination, such as the circuit shown in FIG. 1, or a differential signal driver circuit. In other instances input circuit is a logic gate (e.g., AND gate, NOR gate) constructed using, for example, emitter-coupled logic or source-coupled FET logic topologies. Thus buffer 200 functions in some instances as an output buffer for one or more logic cells (sets of logic gates) for an integrated circuit output.

In another embodiment, the source-follower buffer portion of the FIG. 1 circuit is replaced with an embodiment as shown in FIGS. 3, 4, and 6. In these configurations, $V_3$, $V_{\bar{3}}$ are provided at nodes 38 and 40.

Buffer 200 drives various loads and is especially suitable for driving capacitive loads. The push-pull topology, working with a peaking capacitor, makes the signal edge rise or fall faster than in a conventional topology. Load 210 is, for example, another differential amplifier circuit. In another example, load 210 is biased close to $V_{SS}$ (e.g., 0.5–0.8 V). Load 210 may be an output cell for an integrated circuit, a circuit used for driving a charge pump, or a phase detector circuit. Often circuits such as charge pumps or phase detectors need their outputs to operate linearly over as much of the supply voltage range as possible. Such circuits are more readily able to do this if their inputs are held close to the lower supply voltage. Thus buffer 200 functions in some instances as an input buffer for an integrated circuit.

Input circuit 208 and load 210 are illustrative of various circuits that are coupled to realize the advantages of buffer 200 embodiments. Thus it should be understood that various changes, substitutions, and alterations may be made without departing from the spirit and scope of the invention. The complementary signals described herein are illustrative of binary logic applications, but embodiments are not limited solely to such applications. The invention is therefore limited only by the following claims.

We claim:

1. A buffer comprising:
    an output stage comprising a first push-pull transistor pair and a second push-pull transistor pair, a first transistor of the second push-pull pair being coupled to receive at a control terminal a first input signal, and a first transistor of the first push-pull pair being coupled to receive at a control terminal a complement of the first input signal; and
    a level shifting compensation circuit comprising:
        a first transistor coupled in a first current mirror configuration with a second transistor of the first push-pull pair;
        a second transistor coupled in a second current mirror configuration with a second transistor of the second push-pull pair;
        a third transistor coupled to receive at a control terminal a second input signal and to control, in response to the second input signal, current in the first current mirror; and
        a fourth transistor coupled to receive at a control terminal a complement of the second input signal and to control, in response to the complement of the second input signal, current in the second current mirror.

2. The buffer of claim 1, wherein a current handling terminal of the third transistor of the compensation circuit is coupled to the control terminal of the first transistor in the first push-pull pair, and a current handling terminal of the fourth transistor in the compensation circuit is coupled to the control terminal of the first transistor in the second push-pull pair.

3. The buffer of claim 2, wherein the control terminal of the third transistor in the compensation circuit is coupled to the control terminal of the first transistor in the second push-pull pair, and the control terminal of the fourth transistor in the compensation circuit is coupled to the control terminal of the first transistor in the first push-pull pair.

4. The buffer of claim 1, wherein the control terminal of the third transistor in the compensation circuit is coupled to the control terminal of the first transistor in the second push-pull pair, and the control terminal of the fourth transistor in the compensation circuit is coupled to the control terminal of the first transistor in the first push-pull pair.

5. The buffer of claim 4 further comprising a differential amplifier coupled to output the input signal received by the third transistor of the level shifting compensation circuit, and coupled to output the complement of the input signal received by the fourth transistor of the level shifting compensation circuit.

6. The buffer of claim 1 further comprising:
    a first impedance and a first capacitance coupled in parallel between the third transistor of the compensation circuit and the first current mirror; and
    a second impedance and a second capacitance coupled in parallel between the fourth transistor of the compensation circuit and the second current mirror.

7. The buffer of claim 6 further comprising:
    a third impedance coupled between a current handling terminal and a control terminal of the first transistor in the compensation circuit, and a third capacitance coupled between the control terminal of the first transistor in the compensation circuit and a lower supply voltage line; and a fourth impedance coupled between a current handling terminal and a control terminal of the second transistor in the compensation circuit, and a fourth capacitance coupled between the control terminal of the second transistor in the compensation circuit and the lower supply voltage line.

8. The buffer of claim 1 further comprising:

a first capacitance coupled between a control terminal of the first transistor of the compensation circuit and a lower supply voltage line; and a second capacitance coupled between a control terminal of the second transistor of the compensation circuit and the lower supply voltage line.

9. The buffer of claim 1, wherein a current handling terminal of the third transistor of the compensation circuit and a current handling terminal of the fourth transistor of the compensation circuit are both coupled to an upper supply voltage line.

10. The buffer of claim 1, wherein at least some of the transistors comprise gallium arsenide.

11. The buffer of claim 1, wherein all transistors are biased to operate in saturation.

12. The buffer of claim 1 further comprising:

a differential amplifier comprising a first transistor and a second transistor, a control terminal of the first transistor of the differential amplifier being coupled to receive a third input signal, and a control terminal of the second transistor of the differential amplifier being coupled to receive a complement of the third input signal;

a first buffer transistor comprising a control terminal coupled to a current handling terminal of the first transistor of the differential amplifier;

a second buffer transistor comprising a control terminal coupled to a current handling terminal of the second transistor of the differential amplifier;

a first output node coupled to a current handling terminal of the second buffer transistor, the first output node being coupled to output the first input signal;

and a second output node coupled to a current handling terminal of the first buffer transistor, the second output node being coupled to output the complement of the first input signal.

13. The buffer of claim 12 further comprising:

a third output node coupled to the current handling terminal of the second buffer transistor, the third output node being coupled to output the second input signal;

a fourth output node coupled to the current handling terminal of the first buffer transistor, the fourth output node being coupled to output the complement of the second input signal;

a first impedance coupled between the first and third output nodes; and a second impedance coupled between the second and fourth output nodes.

14. A buffering method comprising the acts of:

receiving at a control terminal of a first transistor of a first push-pull configured transistor pair a first input signal;

receiving at a control terminal of a first transistor of a second push-pull configured transistor pair a complement of the input signal;

using a second transistor of the first push-pull pair and a first transistor of a compensation circuit as a first current mirror;

using a second transistor of the second push-pull pair and a second transistor of the compensation circuit as a second current mirror;

using a second input signal received at a control terminal of a third transistor of the compensation circuit to control current in the second current mirror; and using a complement of the second input signal received at a control terminal of a fourth transistor of the compensation circuit to control current in the first current mirror.

15. The method of claim 14, wherein the control terminal of the first transistor in the first push-pull pair is coupled to the control terminal of the third transistor in the compensation circuit, and wherein the control terminal of the first transistor in the second push-pull pair is coupled to the control terminal of the fourth transistor in the compensation circuit.

16. The method of claim 14 further comprising:

coupling a first impedance and a first capacitance in parallel between the third transistor of the compensation circuit and the second current mirror;

and coupling a second impedance and a second capacitance in parallel between the fourth transistor of the compensation circuit and the first current mirror.

17. The method of claim 14 further comprising:

boosting a rising voltage in the first input signal by coupling a current handling terminal of the fourth transistor in the compensation circuit to the control terminal of the first transistor in the first push-pull pair; and boosting a rising voltage in the complement of the first input signal by coupling a current handling terminal of the third transistor in the compensation circuit to the control terminal of the first transistor in the second push-pull pair.

18. The method of claim 14 further comprising:

coupling a first capacitance between a control terminal of the first transistor in the compensation circuit and a lower supply voltage line;

and coupling a second capacitance between a control terminal of the second transistor in the compensation circuit and the lower supply voltage line.

19. The method of claim 14 further comprising:

coupling a current handling terminal of the third transistor in the compensation circuit to an upper supply voltage line; and coupling a current handling terminal of the fourth transistor in the compensation circuit to the upper supply voltage line.

* * * * *